(12) United States Patent
Yu (10) Patent No.: US 11,152,549 B2
(45) Date of Patent: Oct. 19, 2021

(54) LIGHT-EMITTING DIODE DEVICE AND DISPLAY DEVICE

(71) Applicant: AmTRAN Technology Co., Ltd., New Taipei (TW)

(72) Inventor: Hung-Ta Yu, New Taipei (TW)

(73) Assignee: AmTRAN Technology Co., Ltd., New Taipei (TW)

( * ) Notice: Subject to any disclaimer, the term of this patent is extended or adjusted under 35 U.S.C. 154(b) by 0 days.

(21) Appl. No.: 16/984,171

(22) Filed: Aug. 4, 2020

(65) Prior Publication Data

US 2021/0193886 A1 Jun. 24, 2021

(30) Foreign Application Priority Data

Dec. 23, 2019 (TW) ................. 108147251

(51) Int. Cl.
| | | |
|---|---|---|
| *H01L 33/56* | (2010.01) | |
| *H01L 33/58* | (2010.01) | |
| *H01L 25/075* | (2006.01) | |
| *H01L 33/54* | (2010.01) | |
| *H01L 33/48* | (2010.01) | |

(52) U.S. Cl.
CPC .......... *H01L 33/56* (2013.01); *H01L 25/0753* (2013.01); *H01L 33/58* (2013.01); *H01L 33/486* (2013.01); *H01L 33/54* (2013.01); *H01L 2933/0091* (2013.01)

(58) Field of Classification Search
CPC ....... H01L 33/56; H01L 33/58; H01L 33/486; H01L 33/54; H01L 25/0753; H01L 2933/0091
See application file for complete search history.

(56) References Cited

U.S. PATENT DOCUMENTS

| | | | |
|---|---|---|---|
| 7,081,644 B2 | 7/2006 | Flaherty et al. | |
| 7,855,395 B2 | 12/2010 | Lee et al. | |
| 9,689,552 B2 | 6/2017 | Wilcox et al. | |
| 2007/0024357 A1 | 2/2007 | Plymale, Jr. et al. | |
| 2007/0034887 A1* | 2/2007 | Pang | H01L 33/508 257/98 |
| 2009/0283779 A1* | 11/2009 | Negley | H01L 25/0753 257/88 |
| 2013/0323865 A1 | 12/2013 | Loh et al. | |

FOREIGN PATENT DOCUMENTS

| | | |
|---|---|---|
| CN | 102746814 A | 10/2012 |
| CN | 104779337 A | 7/2015 |
| TW | 201504679 A | 2/2015 |
| TW | I578069 B | 4/2017 |
| TW | 201945806 A | 12/2019 |

\* cited by examiner

*Primary Examiner* — Mary Ellen Bowman
(74) *Attorney, Agent, or Firm* — CKC & Partners Co., LLC (57) ABSTRACT

A light-emitting diode (LED) device includes: an LED chip, a first lens, and a second lens. The first lens is disposed over the LED chip and configured to increase the light extraction efficiency of the LED device, and the first lens includes a first content of titanium dioxide. The second lens is disposed over the first lens and configured to alter the light pattern of the LED device, and the second lens includes a second content of titanium dioxide. The second content of titanium dioxide is more than the first content of titanium dioxide.

20 Claims, 11 Drawing Sheets

LIGHT-EMITTING DIODE DEVICE AND DISPLAY DEVICE

CROSS-REFERENCE TO RELATED APPLICATION

This application claims priority to Taiwan Application Serial Number 108147251, filed Dec. 23, 2019, which is herein incorporated by reference in its entirety.

BACKGROUND

Field of Invention

The present disclosure relates to a package structure of a light-emitting diode device.

Description of Related Art

A light-emitting diode (LED) is a solid-state semiconductor device capable of converting electrical energy into light energy. Packaging the LED refers to encapsulating the LED chip in a particular structure which protects the LED chip and light can travel through.

Figure 1A:
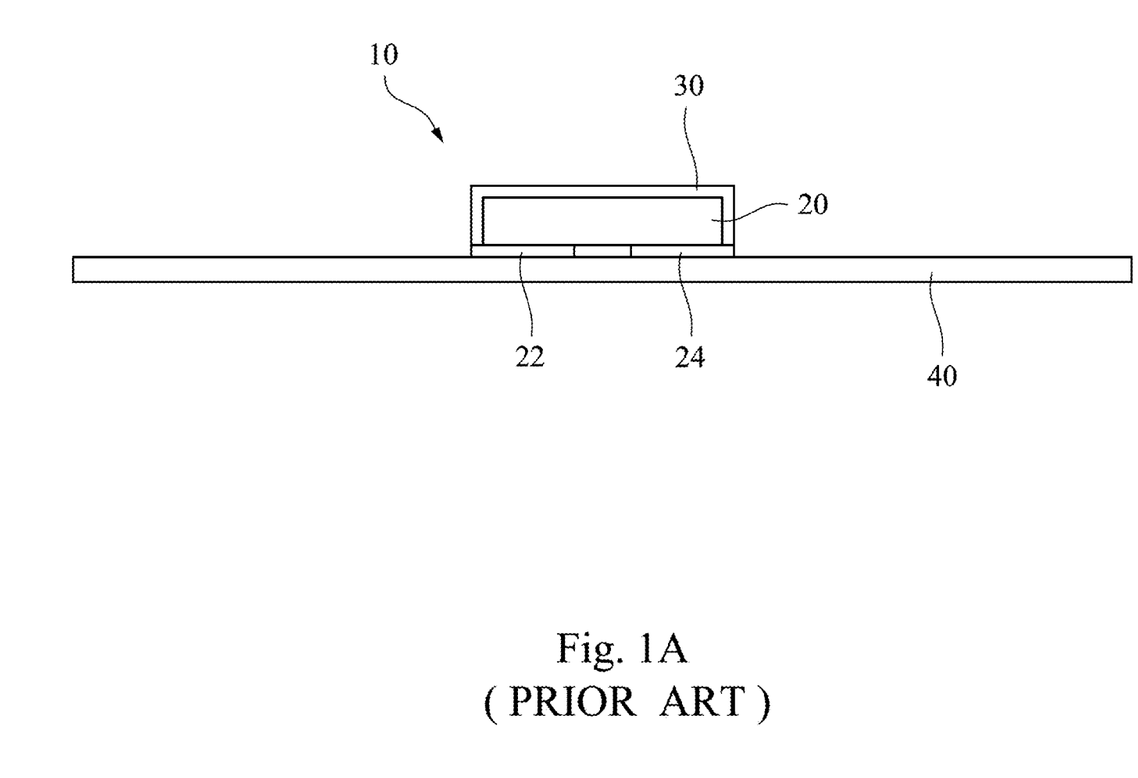
FIG. 1A illustrates a cross-sectional view of a conventional LED device having a chip-scale package.

FIG. 1A illustrates a conventional package structure of an LED device 10. The package structure of the LED device 10 is a flip-chip type of chip-scale package (CSP). An LED chip 20 is disposed on a printed circuit board (PCB) 40 and is electrically connected to the circuits of the PCB 40 through anodized pad 22 and a negative pad 24. The outer part of the LED chip 20 is covered with an encapsulant 30 to protect the LED chip 20. The material of the encapsulant 30 is often a silicone resin having a light refractive index of about 1.4 to 1.51.

In the conventional LED device 10, non-epoxy-resin is often used as the encapsulant 30. However, if the encapsulant 30 is exposed to ultraviolet (UV) lights emitted from the UV LED chip 20 for a long time, such encapsulant 30 will gradually yellow and affect the light extraction efficiency of the LED device 10.

Figure 1B:
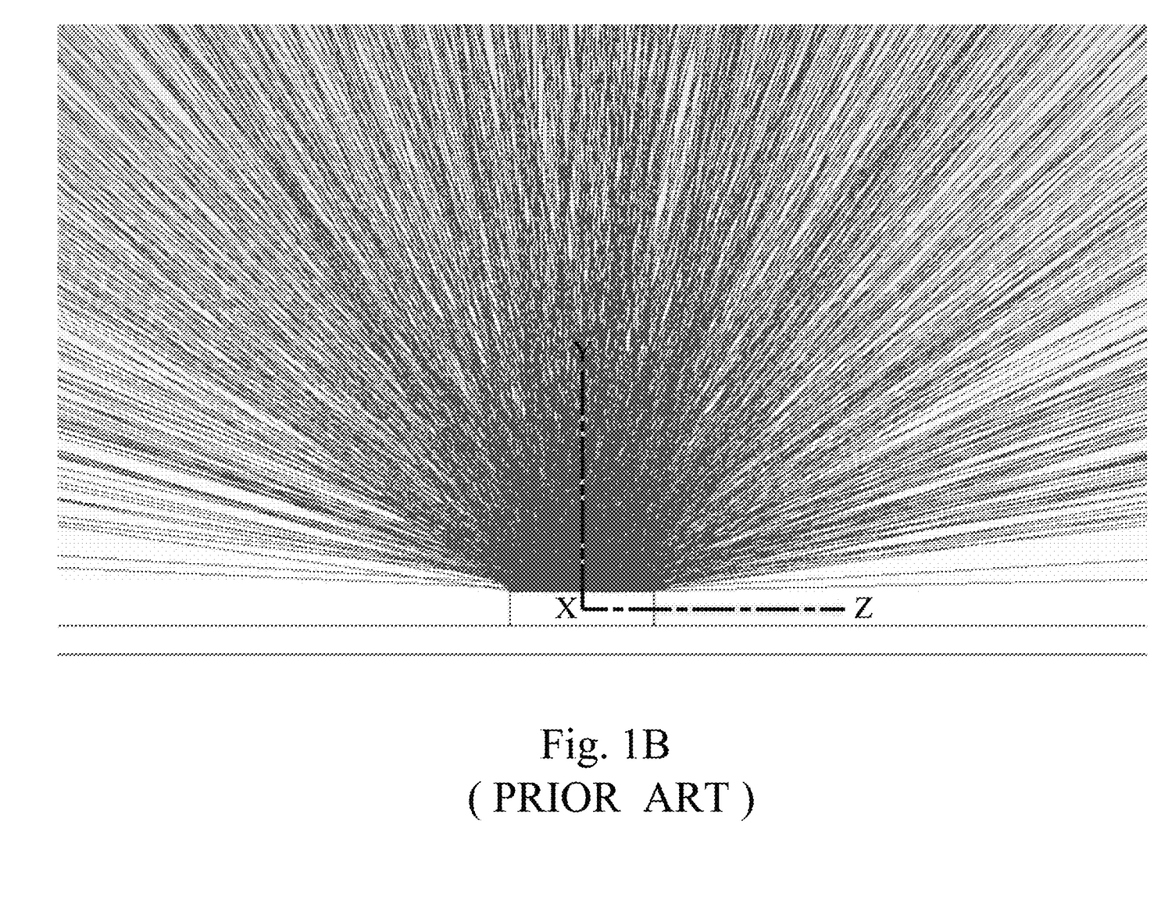
FIG. 1B illustrates the ray trace plot of a conventional LED device having a chip-scale package.
Figure 1C:
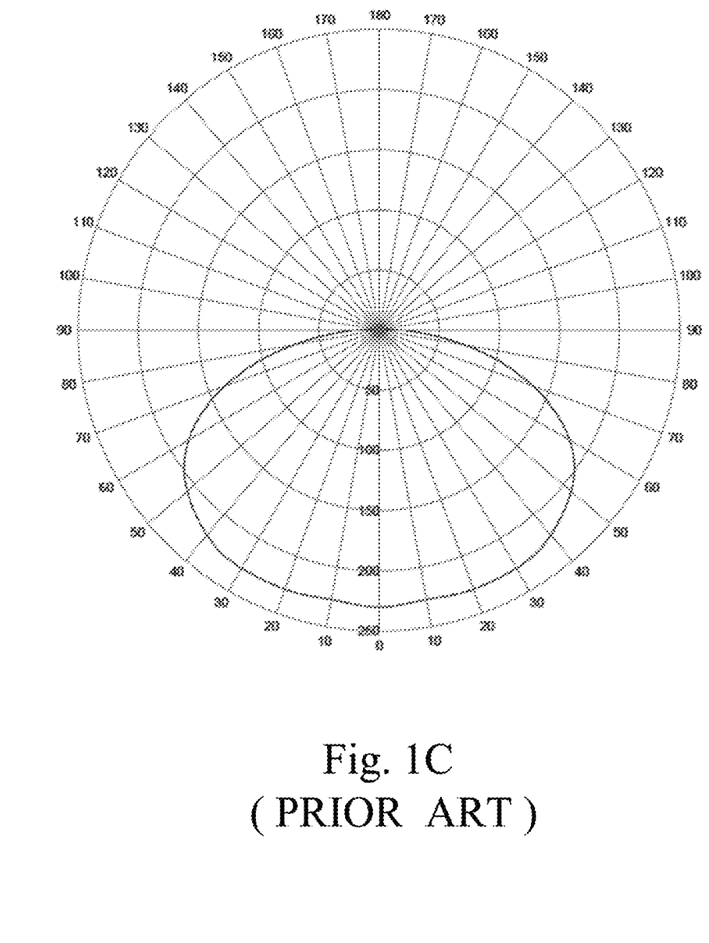
FIG. 1C illustrates a Candela plot (i.e., a light distribution curve) of a conventional LED device having a chip-scale package.

In addition, FIGS. 1B and 1C respectively show the sample of traced rays and the Candela plot for light distribution of the LED device 10 shown in FIG. 1A. A high proportion of the light beams generated by the LED chip 20 are emitted from the upper side of the LED device 10, and the light distribution pattern shown in the Candela plot is an elliptical shape. Therefore, the intensity distribution of the light field provided by the conventional LED device 10 is overly concentrated in the center, which results in poor performance of light uniformity and light emission angles. Because an LED device is a point light source, a conventional LED device often requires an additional design to diffuse the light beams emitted by the LED device more evenly. For example, a secondary optical lens can be added to the LED device in order to provide the desired light pattern.

For instance, LED devices are utilized in display devices. The applications of the display devices are gradually increasing, for example, a display device now can be integrated with multiple functions, such as various camera, communication, display, or other features. The resolutions of display devices are also gradually upgrading; for example, 4K resolution display devices are upgrading to 8K resolution display devices. Utilizing mini LED backlight modules in the display devices can not only provide more and smaller local dimming zones for the display devices, but also achieve high-contrast performance required for high dynamic range (HDR) imaging. In the direct type backlight modules of the existing display devices, which can be LCD TV or computer displays, a secondary optical lens is often disposed to cover the LED device in order to redistribute the light emitted by the LED device, so the light field can meet the requirements of the display devices containing optical cavities with heights more than 10 mm.

However, for the ultra-thin display devices, which contain optical cavities with heights equal to or smaller than 10 mm, the direct type backlight modules cannot be the conventional design mentioned above. Since the minimum height of the optical cavity is restricted by the conventional secondary optical lens for the LED devices, the ultra-thin display device having relatively tiny space inside cannot provide the secondary optical lenses enough light refraction distances and angles required for altering the light pattern of the LED devices, which will cause defects such as uneven mixing of light in the backlight modules.

SUMMARY

Some embodiments of the present disclosure provide an LED device including an LED chip, a first lens, and a second lens. The first lens is disposed over the LED chip and configured to increase the light extraction efficiency, and the first lens comprises a first content of titanium dioxide. A second lens is disposed over the first lens and configured to change the light pattern, and the second lens comprises a second content of titanium dioxide. In the LED device, the second content of titanium dioxide is more than the first content of titanium dioxide.

In some embodiments, the material of the first lens and the second lens includes a silicone epoxy resin.

In some embodiments, the first content of titanium dioxide in the first lens is more than 0.01 weight percent of the first lens.

In some embodiments, the first content of titanium dioxide in the first lens is less than 0.5 weight percent of the first lens.

In some embodiments, the second content of titanium dioxide in the second lens is more than 0.5 weight percent of the second lens.

In some embodiments, the second content of titanium dioxide in the second lens is less than 2 weight percent of the second lens.

In some embodiments, the average particle diameter of the titanium dioxide of the first lens and the titanium dioxide of the second lens is smaller than $1/10$ of the wavelength of the emitted light of the LED chip.

In some embodiments, the average particle diameter of the titanium dioxide of the first lens and the titanium dioxide of the second lens is smaller than 40 nm.

In some embodiments, the LED chip is a blue light chip.

In some embodiments, the LED device is a chip-scale package structure.

Some embodiments of the present disclosure provide an LED device including an LED chip, a first lens, and a second lens. The first lens is disposed over the LED chip and includes titanium dioxide less than 0.5 weight percent of the first lens. The second lens is disposed over the first lens and includes titanium dioxide more than 0.5 weight percent of the second lens.

In some embodiments, the titanium dioxide of the first lens is dispersed in the first lens.

In some embodiments, the titanium dioxide of the second lens is dispersed in the second lens.

In some embodiments, the second lens includes a resin material, and the titanium dioxide of the second lens is formed as a thin film overlaying the resin material of the second lens.

In some embodiments, the first lens directly contacts the LED chip.

In some embodiments, the second lens directly contacts the first lens.

In some embodiments, the first lens is configured to increase the light refraction.

In some embodiments, the light refractive index of the second lens is smaller than the light refractive index of the first lens.

In some embodiments, the light transmittance of the second lens is less than the light transmittance of the first lens.

Some embodiments of the present disclosure provide a display device including any of the LED devices of the embodiments of the present disclosure, and the display device has an optical cavity having a height smaller than 10 mm.

In some embodiments, the LED device is a direct-light-type backlight module of a display device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

In view of the problems of conventional LED devices, such as undesired light pattern or uneven mixing of light, some embodiments of the present disclosure provide the solution, which can alter the light pattern and improve the light extraction efficiency of an LED device by disposing a two-layer lens, wherein the two layers have different content of titanium dioxide respectively.

Figure 2:
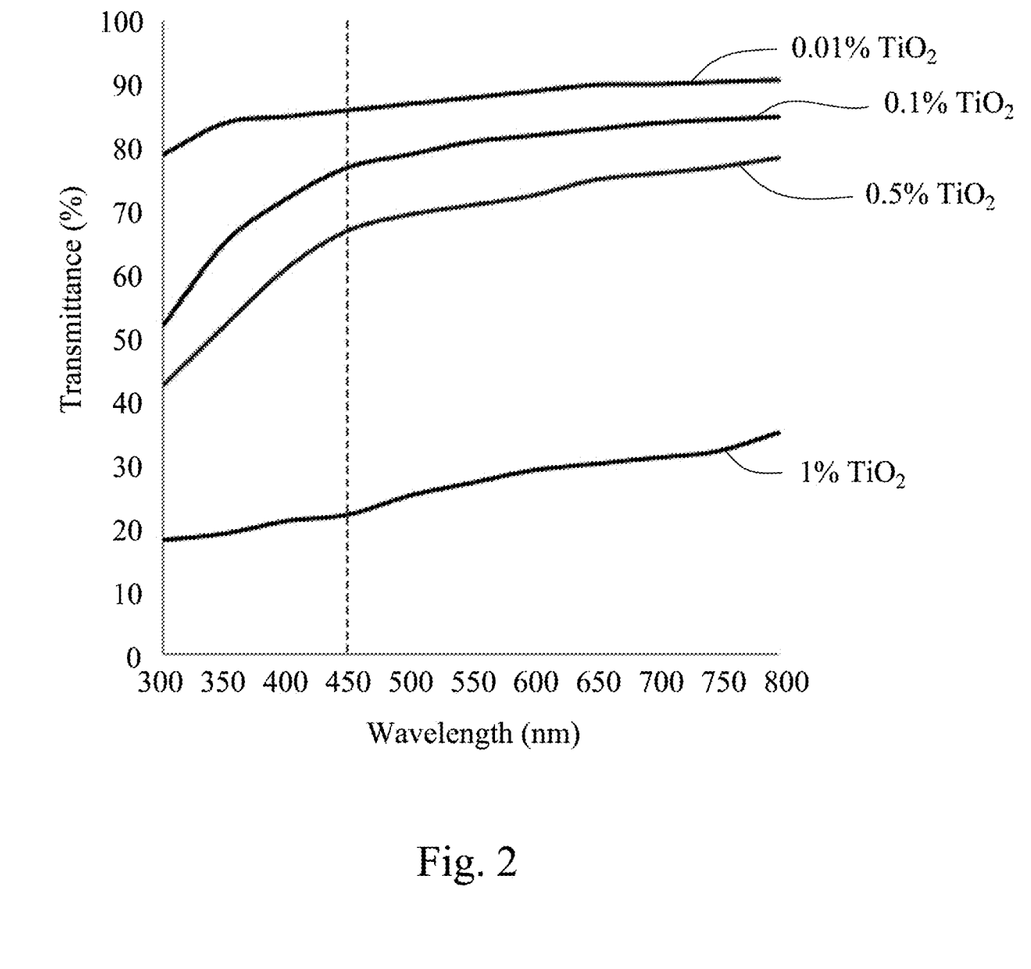
FIG. 2 shows the relationship between the various content of titanium dioxide and light transmittance.

FIG. 2 shows the relationship between the various content of titanium dioxide in a silicone epoxy resin layer and light transmittance of the silicone epoxy resin layer. The particle diameters of the titanium dioxide in the tests shown in FIG. 2 are smaller than 40 nm. As the tests shown in FIG. 2, the silicone epoxy resin layers with different content of titanium dioxide ($TiO_2$), such as 0.01 weight percent, 0.1 weight percent, 0.5 weight percent, and 1 weight percent, were tested respectively for obtaining the light transmittance of the tested silicone epoxy resin layers at different light wavelengths.

The dotted line in FIG. 2 is the wavelength of 450 nm, which is the applied wavelength of a typical blue LED chip. FIG. 2 shows that increasing content of titanium dioxide particles leads to a significant reduction of light transmittance for the light with the wavelengths in the range of UV, such as the light with wavelengths shorter than 400 nm. Accordingly, a silicone epoxy resin layer mixed with titanium dioxide particles disposed on the LED chip can effectively filter a portion of the emitted UV light and improve the color purity of the blue light emitted from the LED device. In addition, a silicone epoxy resin layer has better resistance to UV light, so the silicone epoxy resin layer will not yellow as easily as the encapsulant 30 used in the conventional LED devices. The mixed titanium dioxide particles also reduce the transmittance of UV light and enhance absorption of UV light.

FIG. 2 also shows that when 1 weight percent titanium dioxide was added into the silicone epoxy resin, the light transmittance at the wavelength of 450 nm was about 20%. When 0.5 weight percent titanium dioxide was added into the silicone epoxy resin, the light transmittance at the wavelength of 450 nm was about 65%. When 0.01 to 0.1 weight percent titanium dioxide was added into the silicone epoxy resin, the light transmittance at the wavelength of 450 nm was about 75% to 85%. Therefore, when less than 0.1 weight percent titanium dioxide is added into the silicone epoxy resin, the effect of altering the light transmittance made by the added titanium dioxide becomes smaller. According to the test results shown in FIG. 2, a silicone epoxy resin layer mixed with titanium dioxide particles disposed on the LED chip can provide the desired light transmittances or light patterns by adjusting the content of the titanium dioxide within the silicone epoxy resin layer.

Figure 3:
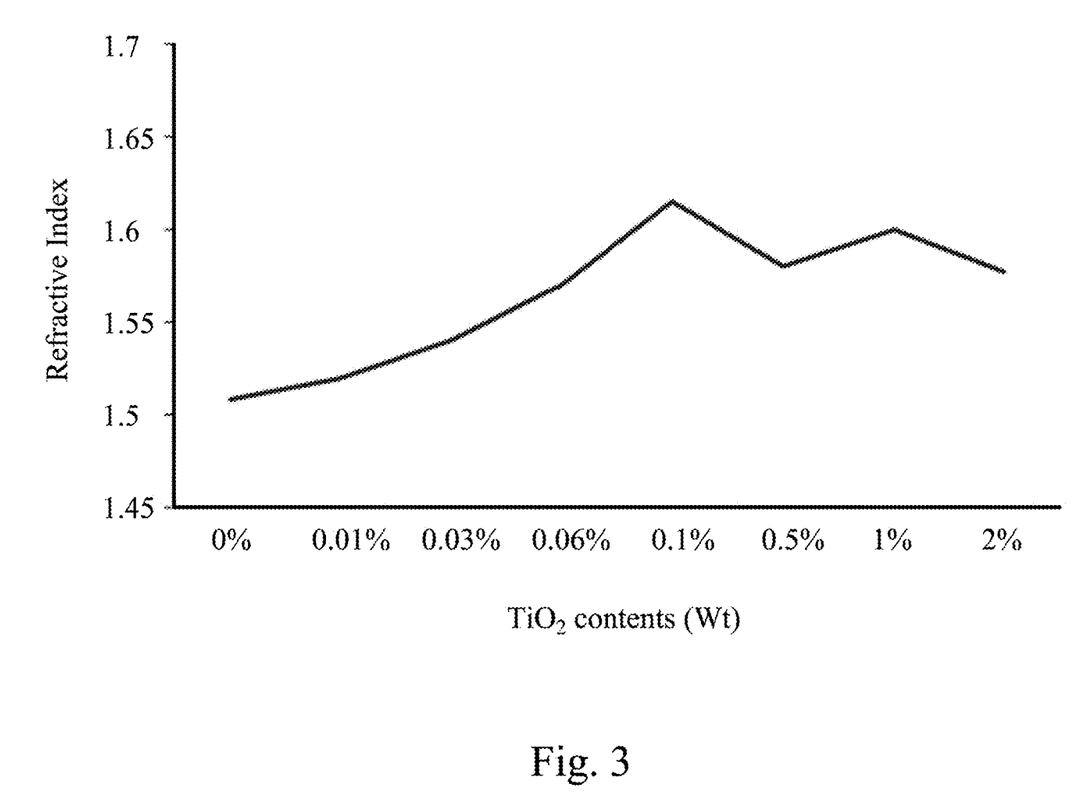
FIG. 3 shows the relationship between the various content of titanium dioxide and light refractive index.

FIG. 3 shows the relationship of titanium dioxide content in a silicone epoxy resin layer and the refractive index for blue light with wavelengths from 445 to 450 nm in such silicone epoxy resin layer, wherein the diameters of the tested titanium dioxide particles are smaller than 40 nm. According to FIG. 3, when the silicone epoxy resin layer is not mixed with titanium dioxide particles, the refractive index for blue light in the silicone epoxy resin layer is about 1.5. When the content of titanium dioxide particles is gradually increased to 0.1 weight percent, the refractive index for blue light in the silicone epoxy resin layer increases as well. The highest refractive index for blue light, about 1.61 to 1.62, in the test is reached at 0.1 weight percent titanium dioxide particles mixed within the silicone epoxy resin layer. If the content of titanium dioxide particles is increased over 0.1 weight percent, the refractive index for blue light in the silicone epoxy resin layer decreases in contrast. For example, when the content of the titanium dioxide particles is gradually increased to 0.5 weight percent, the refractive index for blue light in the silicone epoxy resin layer gradually decreases to about 1.58.

According to the test results shown in FIGS. 2 and 3, the titanium dioxide powder having nanometer-scale particle size mixed in the encapsulant of silicone epoxy resin can provide various optical properties. When the content of titanium dioxide particles is low, e.g., less than 0.1 weight percent, the effect on the transmittance of light having wavelengths longer than 450 nm is small, i.e., there is not much reduction in transmittance while the content of titanium dioxide gradually increases to 0.1 weight percent. At the same time, the refractive index of the silicone epoxy resin layer mixed with titanium dioxide particles rises from 1.51 to about 1.61, while the content of titanium dioxide particles gradually increases to 0.1 weight percent. Alternatively, if the content of mixed titanium dioxide particles is more than 0.5 weight percent, the titanium dioxide particles will aggregate within the silicone epoxy resin and cannot maintain dispersion status, thereby the light extraction efficiency is no longer improved by the refractions between particles within the silicone epoxy resin layer. The aggregation phenomenon of particles may result in Rayleigh scattering and leads to a significant decrease in transmittance of blue light.

Therefore, a two-layer structure of lenses disposed in an LED device is disclosed according to some embodiments of the present disclosure, and different content of titanium dioxide particles are added into the silicone epoxy resin layers, wherein the first layer of the lenses is configured to increase the light extraction efficiency, and the second layer of the lenses is configured to alter the light pattern of the emitted light.

Figure 4A:
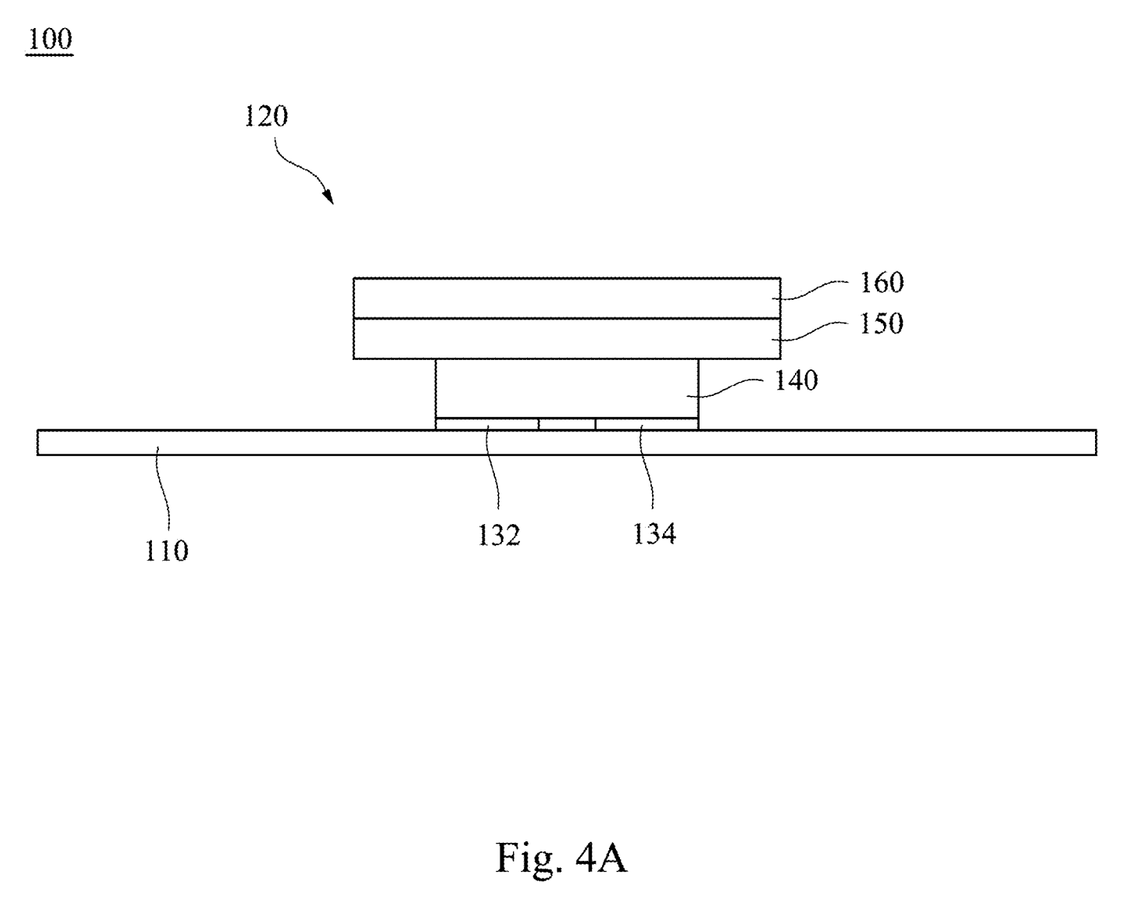
FIG. 4A illustrates a cross-sectional view of the structure of an LED device in accordance with some embodiments of the present disclosure.

FIG. 4A illustrates an LED device 100 according to some embodiments of the present disclosure. The LED device 100 includes a substrate 110 and an LED structure 120 which is disposed on the substrate 110. The LED structure 120 includes a first pad 132, a second pad 134, an LED chip 140, a first lens 150, and a second lens 160.

In some embodiments of the present disclosure, one or more LED structures 120 may be disposed on the substrate 110, and the substrate 110 may be a printed circuit board (PCB), for example. In some embodiments, the substrate 110 is coated with white paint having 80% to 90% light reflectivity, so the light emitted from the LED chip 140 toward the substrate 110 will be reflected outward.

The LED chip 140 is disposed on the substrate 110 and is electrically connected to the circuits of the substrate 110 through the first pad 132, such as an anode pad, and the second pad 134, such as a cathode pad. In addition, in some embodiments, the LED chip 140 is fixed on the substrate 110 by an adhesive, such as epoxy resin.

In some embodiments of the present disclosure, the LED chip 140 is a blue light LED chip, such as a gallium nitride (GaN) chip or a gallium phosphide (GaP) chip, and the emitted light of the LED chip 140 has wavelengths between 430 and 480 nm, for example, 440 to 460 nm.

The first lens 150 is disposed over the LED chip 140. In some embodiments, the first lens 150 directly contacts the LED chip 140. The first lens 150 is made of silicone epoxy resin containing titanium dioxide particles dispersed therein, wherein the titanium dioxide particles are at a content in a range of about 0.01 to about 0.5 weight percent. The particle diameter of the titanium dioxide particles is smaller than $\frac{1}{10}$ of the wavelength of the light emitted from the blue LED chip 140, for example, smaller than 40 nm.

In some embodiments of the present disclosure, the titanium dioxide particles are mixed with the silicone epoxy resin which forms the first lens 150 on the LED chip 140 by a molding process.

In some embodiments of the present disclosure, the first lens 150 is configured to increase the light extraction efficiency of the LED device. According to Snell's Law, when the light is toward an optically rarer medium from an optically denser medium at an angle of incidence which is greater than the critical angle, the light will not refract through the optically rarer medium but reflect back to the optically denser medium. Such phenomenon refers to total internal reflection. For example, a gallium nitride (GaN) LED chip is used as the light source, which is the optically denser medium with the refractive indexes n=2.5. If the difference in refractive index between the encapsulant and the GaN LED chip covered by the encapsulant is too large, a large portion of the emitted light will be reflected back in the inside of the GaN LED chip in accordance with Snell's Law, and therefore the light extraction efficiency will be reduced. The refractive index of the encapsulating silicone resin contacting the LED chip in the prior art LED device is within the range from about 1.4 to about 1.51, so the light extraction efficiency of the conventional LED device is affected by the difference in the refractive indexes of materials.

Conversely, in the embodiments of the present disclosure, the first lens 150 in the LED structure 120 is made of silicone epoxy resin, wherein a particular proportion of titanium dioxide particles is added into the silicone epoxy resin, and silicone epoxy resin having titanium dioxide particles added forms the polygonal geometry shape of the first lens 150 which contacts the LED chip 140 directly. The first lens 150 can be formed by a molding process and thereby adhered to the LED chip 140. As the first lens 150 is added with 0.01 to 0.5 weight percent titanium dioxide particles, the light refractive index of the first lens 150 is increased to about 1.61. Therefore, the light extraction efficiency of LED device 100 according to some embodiments of the present disclosure can be enhanced comparing to the prior art LED devices.

Please refer to FIG. 4A again, which illustrates the second lens 160 disposed on or outside the first lens 150. In some embodiments of the present disclosure, the second lens 160 directly contacts the first lens 150, and the second lens 160 is made of silicone epoxy resin having titanium dioxide particles dispersed within, wherein the titanium dioxide particles are at a content in a range of about 0.5 to about 0.2 weight percent. The particle diameter of the titanium dioxide particles is smaller than 1/10 of the wavelength of the light emitted from the blue LED chip 140, for example, smaller than 40 nm.

In some embodiments of the present disclosure, the silicone epoxy resin layer having titanium dioxide particles dispersed therein forms the second lens 160 on the first lens 150 by a molding process. In other words, the forming process of the second lens 160 is similar to the forming process of the first lens 150. The difference between the forming processes is that a higher content of titanium dioxide particles is mixed within the silicone epoxy resin layer of the second lens 160.

In other embodiments of the present disclosure, the silicone epoxy resin layer is formed on the first lens 150 by a molding process. After that, a thin titanium dioxide film is deposited on the silicone epoxy resin layer by a vacuum deposition process, such that the structure of the thin titanium dioxide film overlaying the silicone epoxy resin layer forms the second lens 160.

In other embodiments of the present disclosure, the second lens 160 is configured to alter the light pattern of the emitted light. The content of the titanium dioxide particles in the silicone epoxy resin layer is in the range of about 0.5 to about 2 weight percent, which makes the refractive index of the second lens 160 is smaller than that of the first lens 150, so the light transmittance in silicone epoxy resin layer of the second lens 160 is decreased, and the effect of altering the light pattern can be achieved.

According to the test results shown in FIGS. 2 and 3, when the content of titanium dioxide particles in the silicone epoxy resin layer is higher than a critical proportion, the titanium dioxide particles aggregate and form large particles. Such large particles may have particle sizes larger than 1/10 of blue light wavelength, thereby resulting in Rayleigh scattering in the silicone epoxy resin layer and causing the transmittance of the blue light to be decreased. The second lens 160 is specifically designed to take advantage of Rayleigh scattering caused by the large titanium dioxide particles, such that the light scattering effect in the second lens 160 is increased and the transmittance of the light toward directly above from the second lens 160 is reduced. Furthermore, the light in the second lens 160 will be reflected more frequently, and part of the light will be refracted again, so the light distribution pattern of the light emitted from the lenses will be altered as the target of the design.

Figure 4B:
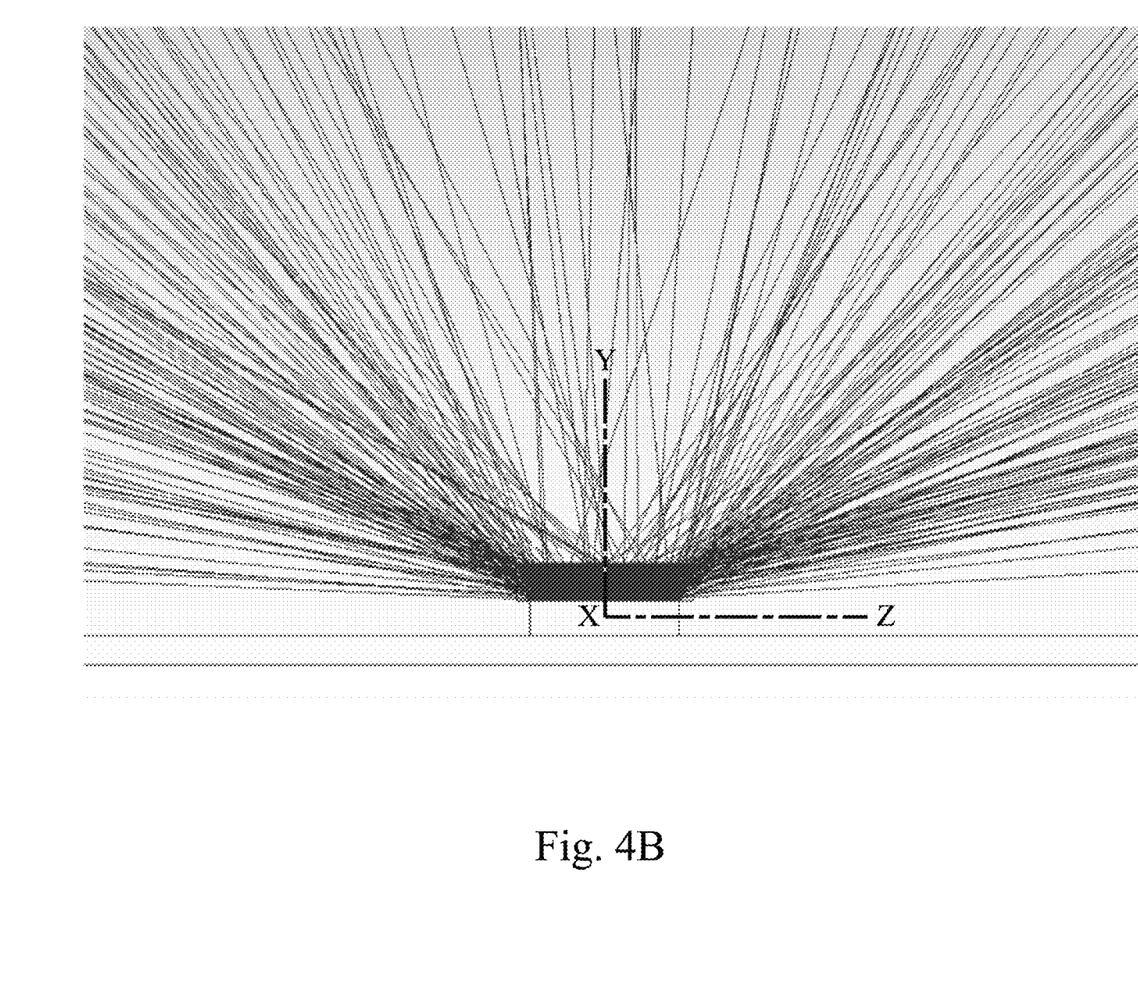
FIG. 4B illustrates a ray trace plot of an LED device in accordance with some embodiments of the present disclosure.
Figure 4C:
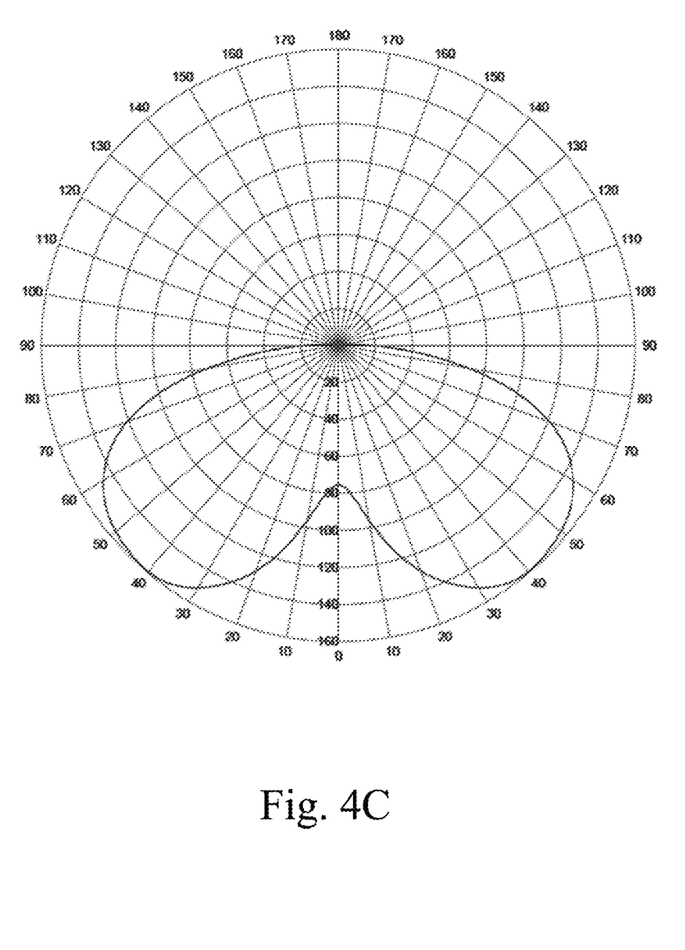
FIG. 4C illustrates a Candela plot (i.e., a light distribution curve) of an LED device in accordance with some embodiments of the present disclosure.

FIGS. 4B and 4C respectively show the sample of traced rays and the Candela plot for light distribution of the LED device 100 illustrated in FIG. 4A. The transmittance of the light emitted from the upper side of the LED device 100 is reduced, and a part of the reflected light is refracted again by the lenses. Therefore, the light distribution pattern of the LED device 100 has a bat-wing shape, as shown in FIG. 4C. Accordingly, the LED device 100 is able to provide shorter light mixing distance, and thus the thinner backlight module design can be achieved with the LED device 100.

Conversely, the conventional LED devices, such as the LED device 10 shown in FIG. 1A, are required to have secondary optical lenses covering the LED package to achieve the light distribution pattern similar as the one shown in FIG. 4C.

In some embodiments of the present disclosure, the concentration of the titanium dioxide particles dispersed in the second lens 160 can be adjusted in order to provide the desired light pattern. For example, when the light emitted toward directly above the LED device is required to have higher intensity, the content of titanium dioxide particles added during the process of forming the second lens 160 should be less. Alternatively, when light emitted toward directly above the LED device is required to have lower intensity, the content of titanium dioxide particles added during the process of forming the second lens 160 should be more.

In some embodiments of the present disclosure, the first lens 150 and the second lens 160 are two planar layers or layers having planar surfaces. In some other embodiments of the present disclosure, the first lens 150 and the second lens 160 may be two layers with arc shapes, for example, lenses with convex-shaped or concave-shaped structures.

In some embodiments of the present disclosure, the LED structure 120 is formed on the substrate 110, such that the LED chip 140 is electrically connected to the substrate through the first pad 132 and the second pad 134 and adhered to the substrate 110 by an adhesive. After the LED structure 120 is formed, the first lens 150 is formed over or on the LED chip 140, and the second lens 160 is formed over or on the first lens 150.

In some other embodiments of the present disclosure, the first lens 150 is formed on the LED chip 140, and then the second lens 160 is formed on the first lens 150. After the lenses are formed, the LED structure 120 having the lenses is electrically connected to the substrate 110 through the first pad 132 and the second pad 134, and the LED chip 140 is adhered to the substrate 110 by an adhesive.

Figure 5A:
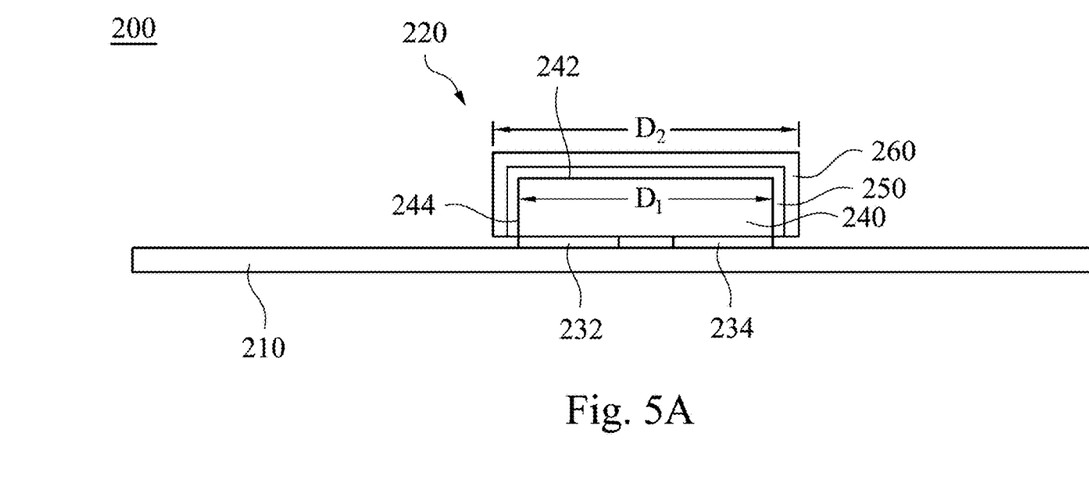
FIGS. 5A and 5B illustrate cross-sectional views of an LED device in accordance with some embodiments of the present disclosure.

FIG. 5A illustrates an LED device 200 according to some embodiments of the present disclosure. In the LED device 200, an LED package structure 220 is a full-encapsulation package. The first lens 250 and the second lens 260 encapsulate the top surface 242 and the side surfaces 244 of the LED chip 240. The LED chip 240 is disposed on the substrate 210 and electrically connected to the circuits of the substrate 210 through the first pad 232 and the second pad 234.

In some embodiments of the present disclosure, the LED chip 240 has a first dimension D1 as the width, the second lens has a second dimension D2 as the width, and the second dimension D2 is smaller or equal to 1.2 times of the first dimension D1. Therefore, the LED package structure 220 is a chip-scale package LED structure.

Figure 5B:
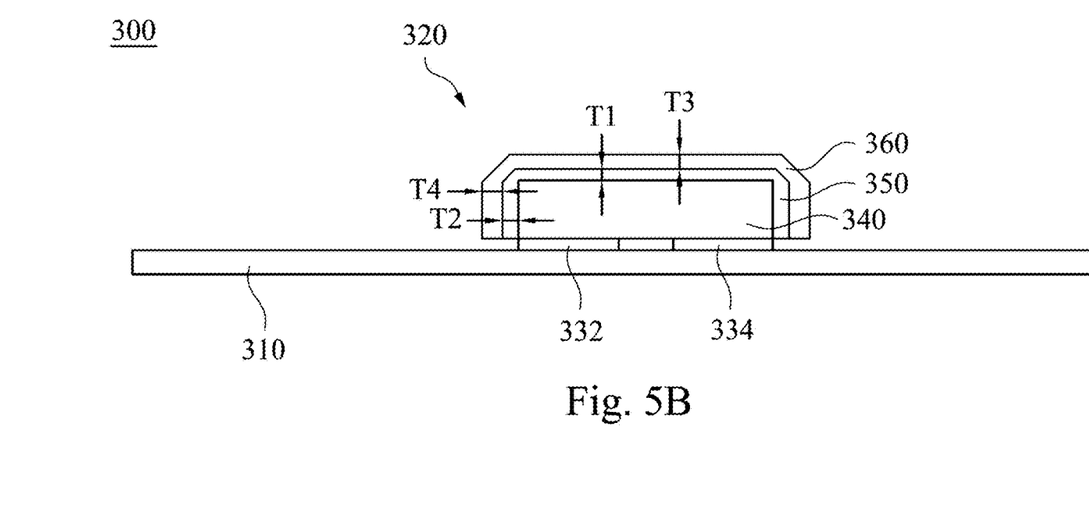

FIG. 5B illustrates an LED device 300 according to some other embodiments of the present disclosure. In LED device 300, the LED package structure 320 is a full-encapsulation package with a polygonal shape. The first lens 350 and the second lens 360 encapsulate the top surface and the side surfaces of the LED chip 340. The LED chip 340 is disposed on the substrate 310 and is electrically connected to the circuits of the substrate through the first pad 332 and the second pad 334.

The part of the first lens 350 encapsulating the top surface of the LED chip 340 has the first thickness T1, and the part of the first lens 350 encapsulating the side surface of the LED chip 340 has the second thickness T2. In some embodiments of the present disclosure, the first thickness T1 may not equal to the second thickness T2. The first thickness T1 and the second thickness T2 of the first lens 350 may be adjusted respectively based on the design requirements, such that the desired or different light extraction efficiencies at the top and side surfaces of the LED package structure 320 can be achieved.

The part of the second lens 360 encapsulating the top surface of the LED chip 340 has the third thickness T3, and the part of the second lens 360 encapsulating the side surface of the LED chip 340 has the fourth thickness T4. In some embodiments of the present disclosure, the third thickness T3 may not equal to the fourth thickness T4. In the embodiments that the second lens 360 is formed by a process of depositing a titanium dioxide film on the silicone epoxy resin layer, the thickness at different parts of the silicone epoxy resin layer can be adjusted during the process of forming the second lens 360, such that the different parts of the second lens 360 can have the required contents of titanium dioxide particles respectively. The third thickness T3 and the fourth thickness T4 may be adjusted respectively based on the design requirements, such that the ideal light distribution patterns at the top and side surfaces of the LED package structure 320 can be achieved.

Figure 6A:
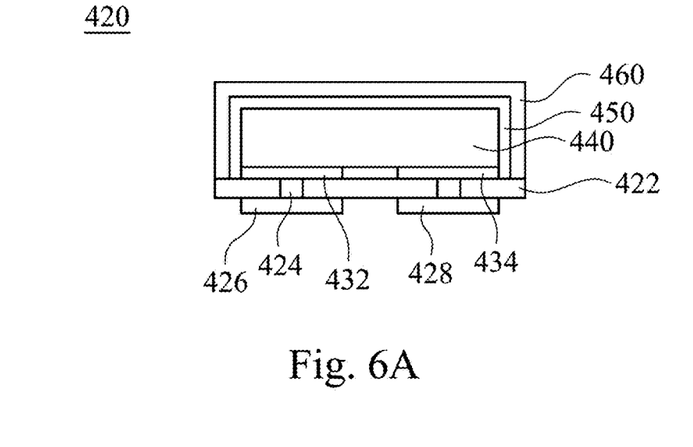
FIGS. 6A and 6B are cross-sectional views of an LED package structure in accordance with some embodiments of the present disclosure.

FIG. 6A illustrates an LED package structure 420 according to some embodiments of the present disclosure. The main difference between the LED package structure 420 and the LED package structures 220 and 320 is that the LED package structure has a frame 422, wherein the frame 422 may be made of a ceramic material or an epoxy resin material.

In the LED package structure 420, the first pad 432 is electrically connected to the first extended pad 426 through a guide hole 424 in the frame 422. The second pad 434 is electrically connected to the second extended pad 428 through another guide hole 424 in the frame 422. The first lens 450 is located over the frame 422 and encapsulates the LED chip 440. The second lens 460 is located over the frame 422 and encapsulates the first lens 450.

Figure 6B:
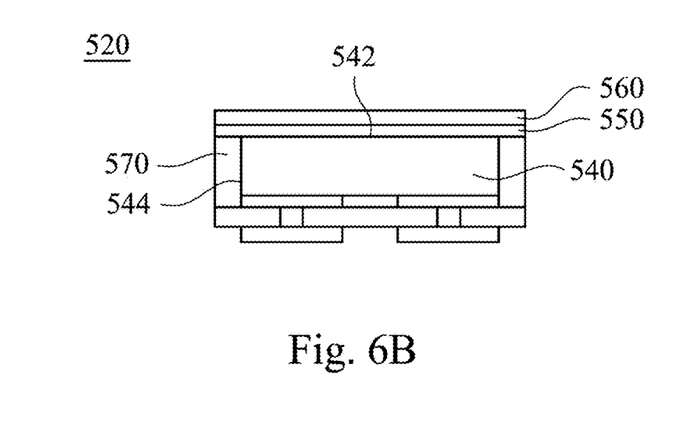

FIG. 6B illustrates an LED package structure 520 according to some embodiments of the present disclosure. The LED package structure 520 is a single-sided illumination package structure. A protective layer 570 is located at the side 544 of the LED chip 540, where the protective layer 570 is made of an opaque material. The first lens 550 is located on the protective layer 570 and encapsulates the top surface 542 of the LED chip 540. The second lens 560 encapsulates the first lens 550.

According to the LED device disclosed in the embodiments of the present disclosure, a two-layer micro-lenses structure, i.e., the first lens and the second lens, is disposed to encapsulate the LED chip. In some embodiments of the present disclosure, such structure can be applied to, for example, the encapsulation package of a mini LED package structure or a micro LED package structure, such as a chip-scale package or a wafer-scale package.

The LED devices disclosed in the embodiments of the present disclosure can be applied to, for example, display devices or lighting devices, but not limited to these. More specifically, the LED devices can be utilized in various lighting devices or components, at least including the backlight modules of the display devices, such as the direct-type backlight modules or the edge-lit backlight modules, the flash lamps, the projection instruments, the glare lighting fixtures, such as the car lights, the searchlights, the flashlights, the work lights, the outdoor high bay lights, and the landscape lights, the low-angle lights, and etc.

Given the backlight sources in a display device as an illustrative embodiment, the improvements provided by the present disclosure are expounded in Table 1 below, which compares the backlight module utilizing the LED device of the present disclosure to the one utilizing the conventional LED devices.

TABLE 1

| Backlight Source | Optics of Lenses | Light Extraction Efficiency (LEE) at the Lens | Effect on LEE of LED Made by the Lenses |
|---|---|---|---|
| Conventional LED Devices | Secondary optical lens covering the LED package is required | 90% (lens material: Polymethylmethacrylate) 85% (lens material: Polycarbonate) | No positive effect |
| The LED Devices of the Present Disclosure | The lenses encapsulate the LED chip directly. A secondary optical lens is not required, so the volume is reduced. | 115% | Improving 15% |

Figure 7:
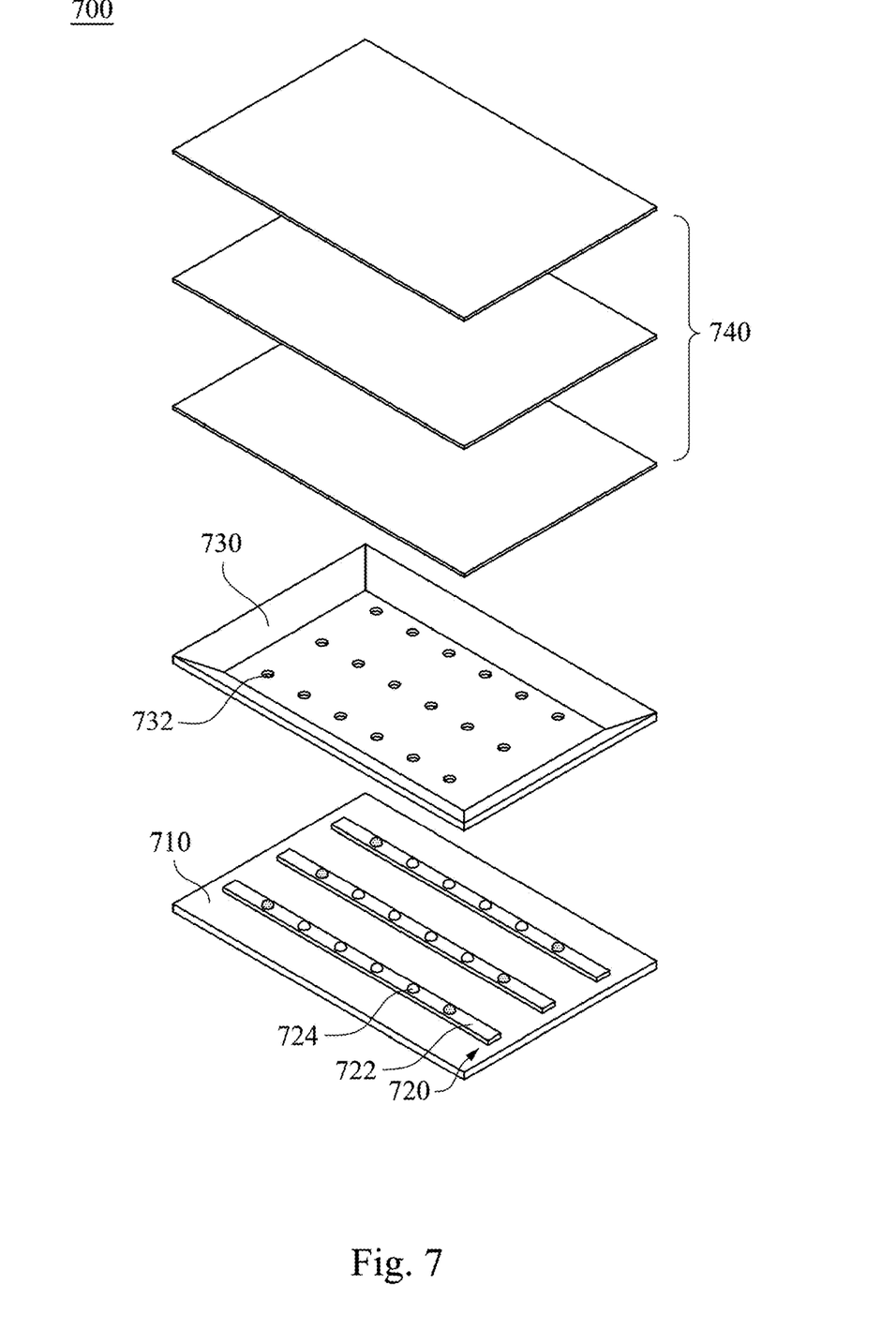
FIG. 7 illustrates an exploded view of a backlight module in accordance with some embodiments of the present disclosure.

FIG. 7 illustrates an exploded view of a backlight module 700 for a display device. The backlight module 700 includes a backplate 710, a plurality light strips 720, a backlight cavity 730, and a plurality of optical films 740.

A plurality of light strips 720 are disposed on the backplate 710, and each of the light strips 720 includes a circuit board 722 and LED components 724. The LED components 724 have the first lens and the second lens as described above.

The backlight cavity 730 is set over the backplate 710 and the light strips 720. The bottom surface of the reflector, as the bottom of the backlight 730, has a plurality of openings 732 respectively corresponding to the plurality of LED components 724. In some embodiments of the present disclosure, the backlight module 700 can be applied in slim display devices or thin display devices, which require the height of the backlight cavity 730 to be less than 10 mm.

A plurality of optical films 740 are disposed over the backlight cavity 730. The optical films may be, for example, a diffuser plate, a prism plate, a diffuser sheet, or the like, which can adjust the optical characteristics of the backlight module 700 as the requirements.

In some embodiments of the present disclosure, a thin display device is disclosed, which requires the height of the optical cavity within the display device is less than 10 mm. The backlight module of the display device includes the LED devices or the LED package structures of the embodiments illustrated in FIG. 4A, 5A, 5B, 6A, or 6B. Therefore, the secondary optical lens required in the conventional LED devices can be omitted. In addition, the light extraction efficiency and the light-mixing effect of the thin display devices and the lighting devices having small optical cavity heights can be enhanced by utilizing the LED packages of the present disclosure.

The foregoing has outlined features of several embodiments so that those skilled in the art can better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A light-emitting diode (LED) device, comprising:
    an LED chip; and
    a package structure directly contacting the LED chip, wherein the package structure comprises:
        a first lens disposed over the LED chip, wherein the first lens directly contacts the LED chip, the first lens is configured to increase light extraction efficiency of the LED device, and the first lens comprises a first content of titanium dioxide; and
        a second lens disposed over the first lens, wherein the second lens is configured to alter a light pattern of the LED device, the second lens comprises a second content of titanium dioxide, and the second content of titanium dioxide is more than the first content of titanium dioxide.

2. The LED device of claim 1, wherein a material of the first lens and the second lens comprises silicone epoxy resin.

3. The LED device of claim 1, wherein the first content of titanium dioxide of the first lens is in a range from 0.01 to 0.5 weight percent of the first lens.

4. The LED device of claim 1, wherein the second content of titanium dioxide of the second lens is in a range from 0.5 to 2 weight percent of the second lens.

5. The LED device of claim 1, wherein an average particle diameter of the titanium dioxide of the first lens and the titanium dioxide of the second lens is smaller than 1/10 of a wavelength of light emitted from the LED device.

6. The LED device of claim 1, wherein the first content of titanium dioxide of the first lens is less than 0.5 weight percent of the first lens, and the second content of titanium dioxide of the second lens is more than 0.5 weight percent of the second lens.

7. The LED device of claim 1, wherein a light refractive index of the second lens is smaller than a light refractive index of the first lens.

8. The LED device of claim 1, wherein a light transmittance of the second lens is smaller than a light transmittance of the first lens.

9. The LED device of claim 1, wherein an average particle diameter of the titanium dioxide of the first lens and the titanium dioxide of the second lens is smaller than 40 nm.

10. The LED device of claim 1, wherein the titanium dioxide of the first lens is dispersed in the first lens.

11. The LED device of claim 1, wherein the titanium dioxide of the second lens is dispersed in the second lens.

12. The LED device of claim 1, wherein the second lens includes a resin material, and the titanium dioxide of the second lens is formed as a thin film overlaying the resin material of the second lens.

13. The LED device of claim 1, wherein the LED device is a chip-scale package structure.

14. The LED device of claim 1, wherein the LED device is a mini LED device or a micro LED device.

15. A display device comprising a backlight module, wherein the backlight module comprising:
    an LED device comprising:
        an LED chip; and
        a package structure directly contacting the LED chip, wherein the package structure comprises:
            a first lens disposed over the LED chip, wherein the first lens directly contacts the LED chip, the first lens is configured to increase light extraction efficiency of the LED device, and the first lens comprises a first content of titanium dioxide; and
            a second lens disposed over the first lens, wherein the second lens is configured to alter a light pattern of the LED device, the second lens comprises a second content of titanium dioxide, and the second content of titanium dioxide is more than the first content of titanium dioxide; and
    an optical cavity disposed over the the LED chip.

16. The display device of claim 15, wherein the optical cavity having a height smaller than 10 mm.

17. The display device of claim 16, wherein the backlight module is a direct-type backlight module.

18. A lighting device comprising an LED device, wherein the LED device comprising:
    an LED chip; and
    a package structure directly contacting the LED chip, wherein the package structure comprises:
        a first lens disposed over the LED chip, wherein the first lens directly contacts LED chip, the first lens is configured to increase light extraction efficiency of the LED device, and the first lens comprises a first content of titanium dioxide; and
        a second lens disposed over the first lens, wherein the second lens is configured to alter a light pattern of the LED device, the second lens comprises a second content of titanium dioxide, and the second content of titanium dioxide is more than the first content of titanium dioxide.

19. The lighting device of claim 18, wherein the LED device comprises a mini LED or a micro LED.

20. The lighting device of claim 18, wherein the LED device has a light distribution pattern with a bat-wing shape.

* * * * *